(12) United States Patent
Hirai et al.

(10) Patent No.: US 8,563,872 B2
(45) Date of Patent: Oct. 22, 2013

(54) WIRING BOARD, WIRING BOARD MANUFACTURING METHOD, AND VIA PASTE

(75) Inventors: Shogo Hirai, Osaka (JP); Hiroyuki Ishitomi, Osaka (JP); Tsuyoshi Himori, Osaka (JP); Satoru Tomekawa, Kyoto (JP); Yutaka Nakayama, Kyoto (JP)

(73) Assignees: Panasonic Corporation, Osaka (JP); Kyoto Elex Co., Ltd., Kyoto (JP)

( * ) Notice: Subject to any disclaimer, the term of this patent is extended or adjusted under 35 U.S.C. 154(b) by 0 days.

(21) Appl. No.: 13/145,271

(22) PCT Filed: Feb. 22, 2011

(86) PCT No.: PCT/JP2011/000988
§ 371 (c)(1),
(2), (4) Date: Jul. 19, 2011

(87) PCT Pub. No.: WO2011/105053
PCT Pub. Date: Sep. 1, 2011

(65) Prior Publication Data
US 2011/0290549 A1    Dec. 1, 2011

(30) Foreign Application Priority Data

Feb. 25, 2010    (JP) ................. 2010-040538

(51) Int. Cl.
*H05K 1/11*    (2006.01)
*H05K 1/09*    (2006.01)
*H01K 3/10*    (2006.01)

(52) U.S. Cl.
USPC ............. 174/264; 29/853; 174/261; 174/263; 174/257

(58) Field of Classification Search
USPC ................. 174/257, 264, 261, 262, 263, 265; 29/853; 439/65
See application file for complete search history.

(56) References Cited

U.S. PATENT DOCUMENTS 5,890,915 A * 4/1999 Reylek ........................... 439/91
5,948,533 A * 9/1999 Gallagher et al. ............ 174/255

(Continued)

FOREIGN PATENT DOCUMENTS

EP    0 793 405 A2    9/1997
EP    1 408 726 A1    4/2004

(Continued)

OTHER PUBLICATIONS

European Search Report issued in European Patent Application No. EP 11728762.3 dated Dec. 16, 2011.

(Continued)

*Primary Examiner* — Timothy Thompson
*Assistant Examiner* — Roshn Varghese
(74) *Attorney, Agent, or Firm* — McDermott Will & Emery LLP

(57) ABSTRACT

A wiring board includes a plurality of wirings laid via an insulating resin layer, and a via-hole conductor provided for electrically connecting the wirings. The via-hole conductor includes metal and resin portions. The metal portion includes a region made of copper particles, a first metal region mainly composed of tin, a tin-copper alloy, or a tin-copper intermetallic compound, and a second metal region mainly composed of bismuth, and has Cu/Sn of from 1.59 to 21.43. The copper particles are in contact with one another, thereby electrically connecting the wirings, and at least part of the first metal region covers around and extends over the portions where the copper particles are in plane contact with one another.

17 Claims, 13 Drawing Sheets

(56) References Cited

U.S. PATENT DOCUMENTS

| | | |
|---|---|---|
| 6,326,555 B1 | 12/2001 | McCormack et al. |
| 6,574,114 B1 * | 6/2003 | Brindle et al. ............... 174/262 |
| 6,774,316 B1 * | 8/2004 | Suzuki et al. ............... 174/262 |
| 7,390,442 B2 * | 6/2008 | Kashihara et al. ............ 252/512 |
| 7,427,717 B2 * | 9/2008 | Morimoto et al. ............ 174/254 |
| 2002/0066961 A1 * | 6/2002 | Tomekawa et al. ............ 257/776 |
| 2003/0234277 A1 * | 12/2003 | Dias et al. ............... 228/180.22 |
| 2005/0011677 A1 | 1/2005 | Yoshino et al. |
| 2005/0172483 A1 | 8/2005 | Sugita et al. |
| 2005/0257952 A1 * | 11/2005 | Morimoto et al. ............ 174/256 |

FOREIGN PATENT DOCUMENTS

| | | |
|---|---|---|
| JP | 10-007933 | 1/1998 |
| JP | 2000-049460 | 2/2000 |
| JP | 2002-094242 | 3/2002 |
| JP | 2002-290052 | 10/2002 |
| JP | 2004-265607 | 9/2004 |
| JP | 2005-136034 | 5/2005 |
| JP | 2009-147026 | 7/2009 |

OTHER PUBLICATIONS

Office Action issued in corresponding U.S. Appl. No. 13/698,539, mailed May 9, 2013.

Office Action issued in U.S. Appl. No. 13/700,999, dated Aug. 13, 2013.

* cited by examiner

⊢—⊣ 10 μm

Sn ELEMENT

10 μm  ELEMENT:Bi

WIRING BOARD, WIRING BOARD MANUFACTURING METHOD, AND VIA PASTE

RELATED APPLICATIONS

This application is the U.S. National Phase under 35 U.S.C. §371 of International Application No. PCT/JP2011/000988, filed on Feb. 22, 2011, which in turn claims the benefit of Japanese Application No. 2010-040538, filed on Feb. 25, 2010, the disclosures of which Applications are incorporated by reference herein.

TECHNICAL FIELD

The present invention relates to a multilayer wiring board in which interlayer electrical connection is made between a plurality of wirings arranged via insulating resin layers. More specifically, it relates to improvements in via-hole conductors for interlayer connection between wirings in multiple layers.

BACKGROUND ART

Conventionally, there is a known multilayer wiring board obtained by making interlayer electrical connection between wirings arranged via insulating resin layers. For such an interlayer connection method, there is a known via-hole conductor as formed by filling a hole provided in an insulating resin layer with conductive paste. In another known via-hole conductor, metallic particles containing Cu are applied instead of the conductive paste, and fixed together by an intermetallic compound.

Concretely, for example, Patent Document 1 below discloses a via-hole conductor having a matrix-domain structure in which a plurality of domains made of Cu particles are dotted in a CuSn compound matrix.

Also, for example, Patent Document 2 below discloses a sinterable composition for use in via-hole conductor formation, which includes a high-melting-point particle-phase material that includes Cu, and a low-melting-point material that is a selected metal such as tin or a tin alloy. Such a sinterable composition is a composition sinterable in the presence of a liquid phase or a transient liquid phase.

Also, for example, Patent Document 3 below discloses a via-hole conductor material in which alloy layers with a solidus temperature of 250° C. or higher are formed on circumferences of copper particles by heating conductive paste, which contains Sn—Bi metallic particles and the copper particles, to a temperature greater than or equal to the melting point of the Sn—Bi metallic particles. Such a via-hole conductor material is described as achieving high connection reliability since interlayer connection is made by joining alloy layers with a solidus temperature of 250° C. or higher and the alloy layers do not melt in temperature-cycling and reflow resistance tests.

Also, for example, Patent Document 4 below discloses a multilayer wiring board provided with via-hole conductors which contain copper and tin in a total amount of 80 to 97% by weight, along with bismuth in a proportion of 3 to 20% by weight.

CITATION LIST

Patent Documents

Patent Document 1: Japanese Laid-Open Patent Publication No. 2000-49460

Patent Document 2: Japanese Laid-Open Patent Publication No. 10-7933

Patent Document 3: Japanese Laid-Open Patent Publication No. 2002-94242

Patent Document 4: Japanese Laid-Open Patent Publication No. 2002-290052

SUMMARY OF INVENTION

Technical Problem

The via-hole conductor disclosed in Patent Document 1 will be described in detail with reference to FIG. 15. FIG. 15 is a schematic cross-sectional view of a via-hole portion of the wiring board disclosed in Patent Document 1.

In the schematic cross-sectional view of the wiring board in FIG. 15, a via-hole conductor 2 is in contact with a wiring 1 formed on the wiring board surface. The via-hole conductor 2 includes a matrix 4 including $Cu_3Sn$ or $Cu_6Sn_5$, which is an intermetallic compound, and copper-containing powder 3 dotted as domains in the matrix 4. In the via-hole conductor 2, a matrix-domain structure is formed by setting the weight ratio represented as Sn/(Cu+Sn) within the range from 0.25 to 0.75. However, the via-hole conductor 2 as such has a problem where voids and cracks (5 in FIG. 15) readily occur under thermal shock testing.

When the via-hole conductor 2 is exposed to heat under, for example, thermal shock testing or reflow processing, such voids and cracks are openings caused by Cu diffusion among the Sn—Bi metallic particles to generate a CuSn compound such as $Cu_3Sn$ or $Cu_6Sn_5$. In addition, such voids are also caused by $Cu_3Sn$, which is an intermetallic compound of Cu and Sn contained in a Cu—Sn diffusion joint formed at a Cu—Sn interface, being heated under any of various reliability tests and turning into $Cu_6Sn_5$ to generate internal stress inside the via-hole conductor 2.

Also, the sinterable composition disclosed in Patent Document 2 is a composition which is generated, for example, during hot pressing for prepreg lamination and sintered in the presence or absence of a transient liquid phase. Such a sinterable composition includes Cu, Sn, and Pb and reaches a high temperature in the range from 180° C. to 325° C. at the time of hot pressing, and therefore it is difficult to render it usable as a standard insulating resin layer (which may also be called a glass epoxy resin layer) to be obtained by impregnating glass fibers with epoxy resin. In addition, it is difficult to render it Pb-free as demanded by the market.

Also, the via-hole conductor material disclosed in Patent Document 3 has alloy layers with high resistance formed on surface layers of copper particles. Accordingly, there is a problem of higher resistance when compared with connection resistance resulting only from contact between Cu particles and between Ag particles as in general conductive paste which contains Cu particles, silver (Ag) powder, etc.

Furthermore, the via-hole conductor disclosed in Patent Document 4 also has alloy layers with high resistance formed on surface layers of Cu particles and therefore has the problem of not being able to achieve interlayer connection with sufficiently low resistance, as will be described later.

An objective of the present invention is to provide a wiring board capable of meeting the need for being Pb-free, in which interlayer connections are achieved by low-resistance via-hole conductors with high connection reliability.

Solution to Problem

One aspect of the present invention is directed to a wiring board comprising an insulating resin layer, a plurality of wirings laid via the insulating resin layer, and a via-hole conductor provided so as to pierce the insulating resin layer for electrically connecting the wirings, wherein the via-hole conductor includes metal and resin portions, the metal portion including at least copper, tin, and Bi, and have a weight ratio (Cu/Sn) of Cu to Sn in the metal portion in the range from 1.59 to 21.43, the metal portion comprises three metal regions, including regions made of copper (Cu) particles, first metal regions, and second metal regions, the copper particles are in contact with one another via plane contact portions, thereby electrically connecting the wirings, the first metal regions are mainly composed of tin (Sn), a tin-copper alloy, and/or a tin-copper intermetallic compound, with at least part thereof covering around and extending over the plane contact portions of the copper particles, and the second metal region are mainly composed of bismuth (Bi).

Also, another aspect of the present invention is directed to a wiring board manufacturing method comprising: a through-hole formation step of forming a through-hole by perforating an uncured or semi-cured prepreg covered by protective films from outside either of the protective films; a filling step of filling the through-hole with via paste; a protrusion step of removing the protective films after the filling step, thereby revealing protrusions formed by the via paste partially projecting from the through-hole; a placement step of placing sheets of metal foil on surfaces of the prepreg so as to cover the protrusions; a compression-bonding step of subjecting the metal foil to compression bonding onto the surfaces of the prepreg; and a heating step of performing heating at a predetermined temperature after the compression-bonding step, wherein the via paste includes Cu particles, Sn—Bi based solder particles, and thermally curable resin, and has a weight ratio (Cu/Sn) of Cu to Sn in the range from 1.59 to 21.43, in the compression-bonding step, the via paste is compressed by way of the protrusions to bring the Cu particles into plane contact with one another, thereby electrically connecting the sheets of metal foil, in the heating step, the compressed via paste is heated to a melting point of the Sn—Bi based solder particles or higher, thereby causing the Sn—Bi based solder particles to cover around and extend over the plane contact portions, and thereafter, generating a Cu—Sn compound so as to cover around and extend over the plane contact portions and Bi phase so as to contact with the Cu—Sn compound.

Also, still another aspect of the present invention is directed to via paste for a wiring board, wherein the wiring board includes an insulating resin layer, a plurality of wirings laid via the insulating resin layer, and a via-hole conductor provided so as to pierce the insulating resin layer for electrically connecting the wirings, the via-hole conductor includes metal and resin portions, the metal portion including at least copper, tin, and Bi, the metal portion comprises three metal regions, including regions made of copper (Cu) particles, first metal regions, and second metal regions, the copper particles are in contact with one another via plane contact portions, thereby electrically connecting the wirings, the first metal regions are mainly composed of tin (Sn), a tin-copper alloy, and/or a tin-copper intermetallic compound, with at least part thereof covering around and extending over the plane contact portions of the copper particles, the second metal regions are mainly composed of bismuth (Bi), and the via paste includes Cu particles, Sn—Bi based solder particles, and thermally curable resin, and has a weight ratio (Cu/Sn) of Cu to Sn in the range from 1.59 to 21.43.

Objects, features, aspects, and advantages of the present invention will be more apparent from the following detailed description and the accompanying drawings.

Advantageous Effects of Invention

The present invention makes it possible to achieve interlayer connection with low resistance by forming a low-resistance conduction path using plane contact portions formed by copper particles contained in via-hole conductors of a multilayer wiring board, which are in plane contact with one another. Also, reinforcement is achieved by first metal regions covering around and extending over plane contact portions where copper particles are in plane contact with one another, the first metal regions being mainly composed of tin, a tin-copper alloy, and/or a tin-copper intermetallic compound, which is/are harder than the copper particles. Thus, the reliability of electrical connection is enhanced.

DESCRIPTION OF EMBODIMENT

An embodiment of the present invention will be described in detail with reference to the drawings.

Figure 1A:
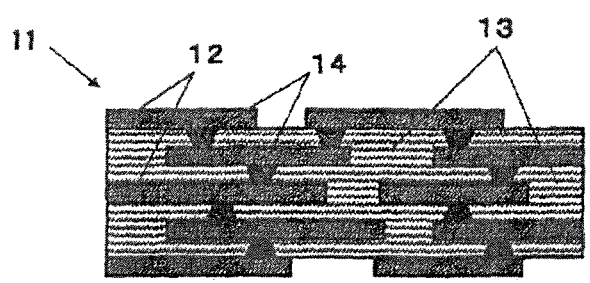
FIG. 1A is a schematic cross-sectional view of a multilayer wiring board 11 in an embodiment.

FIG. 1A is a schematic cross-sectional view of a multilayer wiring board 11 according to the present invention. Also, FIG. 1B is an enlarged schematic cross-sectional view around a via-hole conductor 14 in FIG. 1A.

In the multilayer wiring board 11, via-hole conductors 14 piercing through insulating resin layers 13 provide electrical interlayer connections between a plurality of wirings 12, which are made of metal foil such as copper foil.

Figure 1B:
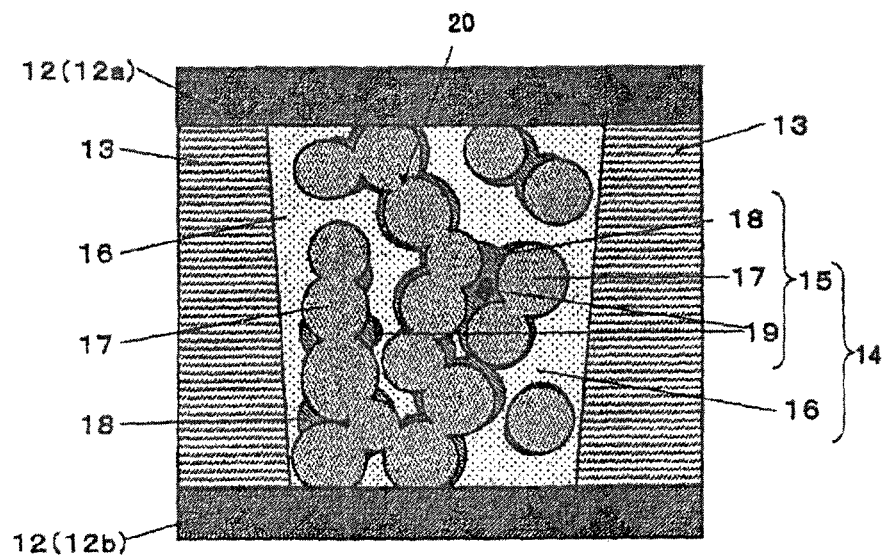
FIG. 1B illustrates an enlarged schematic cross-sectional view around a via-hole conductor 14 in FIG. 1A.

FIG. 1B is an enlarged schematic cross-sectional view around one via-hole conductor 14. In FIG. 1B, "12" denotes the wirings, "13" denotes the insulating resin layer, and "14" denotes the via-hole conductor. In addition, the via-hole conductor 14 includes a metal portion 15 and a resin portion 16. The metal portion 15 includes a number of Cu particles 17, first metal regions 18 mainly composed of tin, a tin-copper alloy, and/or a tin-copper intermetallic compound, and second metal regions 19 mainly composed of Bi. Furthermore, at least part of the Cu particles 17 form a conduction path via plane contact portions in which they are in plane contact with one another, thereby electrically connecting the upper-layer wiring 12 (12a) and the lower-layer wiring 12 (12b).

The Cu particles 17 have an average particle diameter in the range preferably from 0.1 to 20 μm, more preferably from 1 to 10 μm. In the case where the average particle diameter of the Cu particles 17 is excessively small, the number of contact points in the via-hole conductors 14 increases, resulting in higher conduction resistance. Furthermore, particles with such a particle diameter tend to be expensive. On the other hand, in the case where the average particle diameter of the Cu particles 17 is excessively large, it is unlikely to be possible to achieve an increased filling rate when the via-hole conductors 14 are foiled with smaller diameters such as from 100 to 150 μm.

The purity of the Cu particles 17 is preferably 90% by mass or more, more preferably 99% by mass or more, so that the resistance of the via-hole conductors 14 can be sufficiently reduced and the Cu particles 17 can be readily deformed where they are in contact with one another. Note that the Cu particles 17 become softer as the purity thereof increases. High purity is preferable because the Cu particles 17 become more susceptible to deforming in a pressurization step to be described later, resulting in increased contact areas between the Cu particles 17.

Note that the average particle diameter of the Cu particles 17 and the contact portions 20 of the Cu particles 17 are measured and confirmed using a scanning electron microscope (SEM) to observe a sample created by embedding a formed wiring board in resin and thereafter polishing cross sections of via-hole conductors (using microfabrication means, such as focused ion beam, as necessary).

A number of Cu particles 17 are brought into plane contact with one another to form a low-resistance conduction path between the wirings 12a and 12b. Accordingly, it becomes possible to reduce connection resistance between the wirings 12a and 12b.

Note that, in the via-hole conductors 14, the low-resistance conduction path is formed with a complicated network of a number of Cu particles 17 in random contact as shown in FIG. 1B, rather than in orderly arrangement. Forming such a network makes it possible to increase the reliability of electric connections. In addition, a number of Cu particles 17 are in plane contact with one another in random positions. By setting the Cu particles 17 in plane contact with one another in random positions, it becomes possible to allow deformation to disperse stress caused within the via-hole conductors 14 when heated and externally applied force.

The volume percent of the Cu particles 17 contained in the via-hole conductors is preferably 30 to 90% by volume, more preferably 40 to 70% by volume. When the volume percent of the Cu particles is excessively low, the reliability of electrical connections by the conduction paths formed by a number of Cu particles tends to decrease, and when the volume percent is excessively high, resistance values tend to cause fluctuations in a reliability test.

As shown in FIG. 1B, at least part of the first metal regions 18 mainly composed of tin (Sn), a tin-copper alloy, and/or a tin-copper intermetallic compound are formed so as to cover and extend over portions in which the copper particles are in plane contact with one another. In this manner, the contact portions 20 can be strengthened by forming such structures in which the first metal regions 18 cover around the portions in which the copper particles are in plane contact with one another.

The first metal regions 18 are mainly composed of tin, a tin-copper alloy, and/or a tin-copper intermetallic compound. Concretely, for example, they are mainly composed of a simple substance of Sn, $Cu_6Sn_5$, $Cu_3Sn$ or the like. In addition, other metal elements such as Bi and Cu may be included as the remaining components in such a range as not to ruin the effect of the present invention, concretely, in the range of, for example, 10% by mass or less.

Also, the second metal regions 19 mainly composed of Bi and present in the metal portion 15 are preferably in contact with the first metal regions 18 but out of contact with the Cu particles 17, as shown in FIG. 1B. In the via-hole conductors 14, the second metal regions 19 are present so as not to be in contact with the Cu particles 17, and therefore it is possible to suppress the electrical impact as mentioned above on the via-hole conductors 14.

The second metal regions are mainly composed of Bi. In addition, it may include, for example, an alloy or intermetallic compound of Bi and Sn as the remaining component in such a range as not to ruin the effect of the present invention, concretely, in the range of, for example, 20% by mass or less.

Note that since the first and second metal regions are in contact with each other, they normally include both Bi and Sn. In this case, the first metal regions have a higher Sn concentration than the second metal regions, while the second metal regions have a higher Bi concentration than the first metal regions. In addition, it is preferable that the interfaces between the first metal regions and the second metal regions be unclear rather than be clearly defined. When the interfaces are unclear, it is possible to inhibit stress from focusing on the interfaces even under the condition of heating for thermal shock testing or suchlike.

The metal portions included in the via-hole conductors 14 include the copper particles 17, the first metal regions 18 mainly composed of tin, a tin-copper alloy, and/or a tin-copper intermetallic compound, and the second metal regions 19 mainly composed of bismuth, and the weight ratio of Cu to Sn (Cu/Sn) therein is in the range from 1.59 to 21.43. The meaning of the Cu/Sn ratio will be described in detail later.

On the other hand, the resin portions 16 included in the via-hole conductors 14 are made of a hardened material of curable resin. The curable resin is not specifically limited, but concretely, for example, hardened epoxy resin is particularly preferred in view of its superior heat resistance and low linear expansion coefficient.

The volume percent of the resin portions 16 in the via-hole conductors is preferably 0.1 to 50% by volume, more preferably, 0.5 to 40% by volume. When the volume percent of the resin portions 16 is excessively high, resistance values tend to increase, and when the volume percent is excessively low, conductive paste preparation at the time of manufacture tends to be difficult.

Next, the effect of the via-hole conductors 14 in the multilayer wiring board 11 will be schematically described with reference to FIG. 2.

Figure 2:
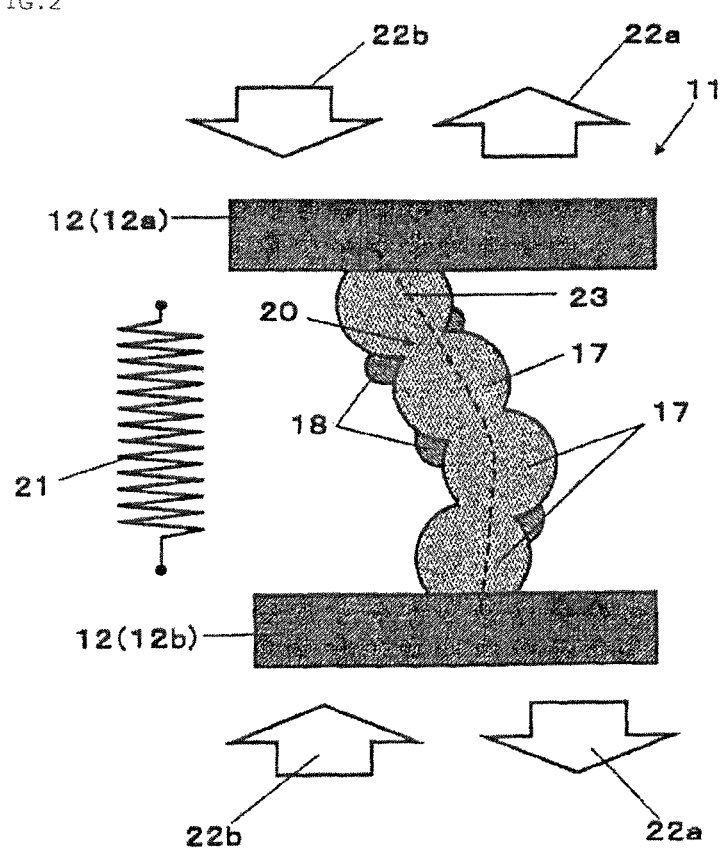
FIG. 2 is an explanatory diagram for description focusing on a conduction path 23 formed by a number of copper particles 17 in plane contact with one another.

FIG. 2 is an explanatory diagram for description focusing on a conduction path 23 formed by a number of Cu particles 17 in plane contact with one another. Also, for the sake of convenience, the resin portion 16 is not shown. Furthermore, "21" denotes a virtual spring shown for describing the effect of the via-hole conductor 14.

As shown in FIG. 2, the conduction path is formed by a number of Cu particles 17 in random contact with one another for electrical interlayer connection between the wirings 12a and 12b. Furthermore, as for the contact portions 20 in which a number of Cu particles 17 are in plane contact with one another, the first metal regions 18 are formed so as to cover around and extend over the contact portions 20.

When internal stress occurs in the multilayer wiring board 11, outward force as indicated by arrows 22a is applied in the multilayer wiring board 11. Such internal stress occurs, for example, at the time of solder reflow or thermal shock testing due to the difference in thermal expansion coefficients between component materials.

Such outward force is weakened through deformation of the Cu particles 17, which are highly flexible, and slight shift in contact positions of the Cu particles 17. At this time, since the hardness of the first metal regions 18 is greater than the hardness of the Cu particles 17, the first metal regions 18 are inclined to resist deformation of the contact portions 20.

Accordingly, in the case where the contact portions 20 between the Cu particles 17 keep on deforming indefinitely, the first metal regions 18 regulate the deformation to some extent, and therefore the deformation does not progress to such an extent that the contact portions 20 between the Cu particles become out of contact. In the case where the conduction paths formed by the Cu particles 17 in contact with one another are likened to springs, when a certain amount of force is applied to the conduction paths, the conduction paths keep on deforming to some extent as if the springs were expanding, and when the conduction paths further keep on deforming, the harder first metal regions 18 regulate the deformation. A similar effect is also achieved when inward force as indicated by arrows 22b is applied to the multilayer wiring board 11. In this manner, as if the conduction paths were the springs 21, deformation of the conduction paths functions to weaken forces in any directions whether they are external or internal, thereby ensuring the reliability of electrical connection.

Next, an exemplary method for manufacturing the multilayer wiring board as described above will be described for each manufacturing step with reference to the drawings.

Figure 4A:
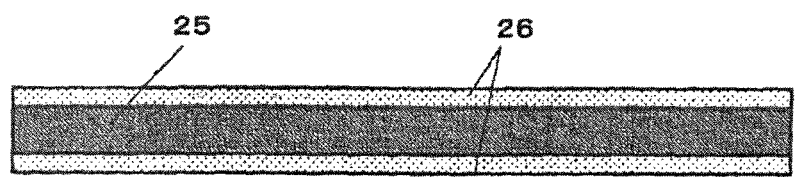
FIG. 4A illustrates a schematic cross-sectional view describing a step in a method for manufacturing a multilayer wiring board.

In the manufacturing method of the present embodiment, initially, protective films 26 are attached to opposite surfaces of an uncured or semi-cured (B-stage) prepreg 25, as shown in FIG. 4A.

Preferably used as the prepreg is an uncured or semi-cured (B-stage) prepreg obtained by drying a fiber substrate impregnated with resin varnish. The fiber substrate may be woven or nonwoven cloth. Specific examples thereof include glass fiber cloth such as glass cloth, glass paper, and glass mat, and also include Kraft paper, linter paper, natural fiber cloth, and organic fiber cloth including aramid fiber. Also, an example of the resin component contained in the resin varnish is epoxy resin. Also, the resin varnish may further include an inorganic filler or suchlike.

Various resin films can be used as protective films. Specific examples thereof include resin films of PET (polyethylene terephthalate), PEN (polyethylene naphthalate), or the like. Such a resin film has a thickness of, preferably, 0.5 to 50 μm, more preferably, 1 to 30 μm. In the case of such a thickness, sufficiently high protrusions made from via paste can be revealed by removing protective films, as will be described later.

If the prepreg has tacky surfaces, using such tackiness is an example of the method for attaching the protective films to the prepreg.

Figure 4B:
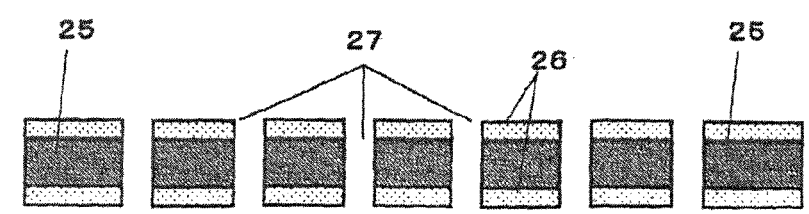
FIG. 4B illustrates a schematic cross-sectional view describing a step subsequent to the step of FIG. 4A in the method for manufacturing the multilayer wiring board.

Next, the prepreg 25 with the protective films 26 disposed thereon is perforated from outside either of the protective films 26, thereby making through-holes 27, as shown in FIG. 4B. Various methods can be used for the perforation, including noncontact processing methods using a carbon dioxide gas laser, a YAG laser, or the like, and other methods using drilling or suchlike. The through-holes have a diameter of, for example, 10 to 500 μm, or even about 50 to 300 μm.

Figure 4C:
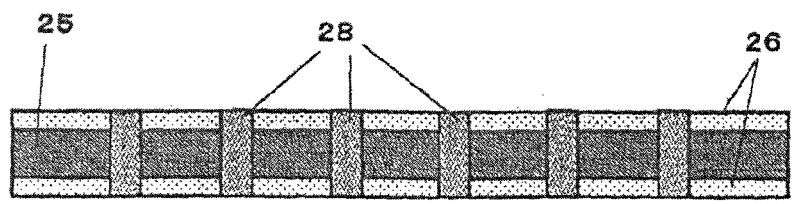
FIG. 4C illustrates a schematic cross-sectional view describing a step subsequent to the step of FIG. 4B in the method for manufacturing the multilayer wiring board.

Next, via paste 28 is applied to completely fill the through-holes 27, as shown in FIG. 4C. The via paste 28 contains Cu particles, Sn—Bi based solder particles containing Sn and Bi, and a curable resin component such as epoxy resin.

The average particle diameter of the Cu particles is in the range of, preferably, from 0.1 to 20 μm, more preferably, from 1 to 10 μm. In the case where the average particle diameter of the Cu particles is excessively small, a high degree of filling in the through-holes 27 tends to be difficult and also expensive. On the other hand, in the case where the average particle diameter of the Cu particles is excessively large, filling tends to be difficult when forming via-hole conductors 14 with smaller diameters.

Also, the Cu particles are not specifically limited to any particle form. Concretely, examples of the form include spherical, flat, polygonal, scaly, flaky forms, and other forms with surface projections. Furthermore, the particles may be primary particles, or secondary particles may be formed.

The Sn—Bi based solder particles are not limited to any specific particulate solder so long as Sn and Bi are contained. The Sn—Bi based solder particles have its eutectic point changeable in the range from about 138° C. to 232° C. by changing its composition ratio or by adding various elements. Furthermore, indium (In), silver (Ag), zinc (Zn) or the like may be added to improve wettability, flowability, etc. Particularly preferable among them is, for example, Sn-58Bi solder, which is environmentally-friendly lead-free solder with a low eutectic point of 138° C.

The average particle diameter of the Sn—Bi based solder particles is in the range of, preferably, from 0.1 to 20 µm, more preferably, from 2 to 15 µm. An excessively small average particle diameter of the Sn—Bi based solder particles increases the specific surface area, resulting in an increased proportion of an oxide film on the surface, which leads to the tendency to be resistant to melting. On the other hand, an excessively large average particle diameter of the Sn—Bi based solder particles leads to the tendency to worsen via-hole fillability.

Specific examples for use as epoxy resin, which is a preferred curable resin component, include glycidyl ether epoxy resin, alycyclic epoxy resin, glycidyl amine epoxy resin, glycidyl ester epoxy resin, and other modified epoxy resin.

Also, a curing agent may be combined with epoxy resin. While the curing agent is not limited to any specific type, it is preferable to use a curing agent which contains an amine compound having at least one or more hydroxyl groups in its molecules. Such a curing agent is preferable in that it functions as a curing catalyst for epoxy resin, and has a function of reducing oxide films present on the surfaces of the Cu particles and the Sn—Bi based solder particles, thereby lessening contact resistance at the time of junction. Among them, the amine compound, which has a boiling point higher than the melting point of the Sn—Bi based solder particles, is particularly preferable in that it is particularly highly effective in lessening the contact resistance at the time of junction.

Specific examples of the amine compound include 2-methylaminoethanol (boiling point: 160° C.), N,N-diethyl ethanolamine (boiling point: 162° C.), N,N-dibutylethanolamine (boiling point: 229° C.), N-methylethanolamine (boiling point: 160° C.), N-methyldiethanolamine (boiling point: 247° C.), N-ethylethanolamine (boiling point: 169° C.), N-butylethanolamine (boiling point: 195° C.), diisopropanolamine (boiling point: 249° C.), N,N-diethylisopropanolamine (boiling point: 125.8° C.), 2,2'-dimethylaminoethanol (boiling point: 135° C.), and triethanolamine (boiling point: 208° C.).

The via paste is prepared by mixing Cu particles, Sn—Bi based solder particles, which contain Sn and Bi, and a curable resin component such as epoxy resin. Concretely, the preparation is performed by, for example, adding Cu particles and Sn—Bi based solder particles to resin varnish which contains epoxy resin, a curing agent, and a predetermined amount of organic solvent, and mixing them by a planetary mixer or suchlike.

The mixing ratio of the curable resin component to a total amount, including a metal component which includes the Cu particles and the Sn—Bi based solder particles, is in the range of, preferably from 0.3 to 30% by mass, more preferably, from 3 to 20% by mass, from the viewpoint of achieving low resistance and ensuring sufficient workability.

Also, it is necessary for the metal component to contain Cu particles at such a content ratio as to accord with the weight ratio of Cu and Sn (Cu/Sn) in the range of from 1.59 to 21.43. The reason for this will be described in detail later. Accordingly, for example, when Sn-58Bi solder particles are used as the Sn—Bi based solder particles, the content ratio of Cu particles is preferably 40 to 90% by mass, more preferably, 55.8 to 65.5% by mass, of a total amount of the Cu particles and the Sn-58Bi solder particles.

The via paste filling method is not specifically limited. Concretely, for example, a method for use in screen printing or suchlike is used. Note that in the manufacturing method of the present embodiment, when filling in through-holes with via paste, it is necessary to fill the through-holes provided in the prepreg in such an amount that the paste is pushed out, so that the via paste partially protrudes from the through-holes provided in the prepreg and protrusions are revealed when the protective films are removed after the filling step.

Figure 4D:
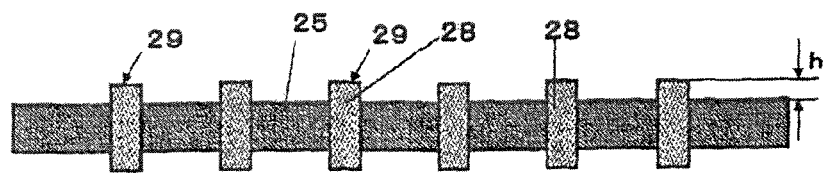
FIG. 4D illustrates a schematic cross-sectional view describing a step subsequent to the step of FIG. 4C in the method for manufacturing the multilayer wiring board.

Next, the protective films 26 are removed from the surfaces of the prepreg 25, so that the via paste 28 partially projects from the through-holes provided in the prepreg 25 to form protrusions 29, as shown in FIG. 4D. Although depending on the thickness of the protective films, the height h of the protrusions 29 is preferably, for example, 0.5 to 50 µm, more preferably, 1 to 30 µm. When the height of the protrusions is excessively high, the paste might be pressed and spread on the prepreg around the through-holes in a compression-bonding step to be described later, which is not preferable, and when the height is excessively low, there is a tendency for sufficient pressure not to be exerted on the applied via paste in the compression-bonding step to be described later.

Figure 5A:
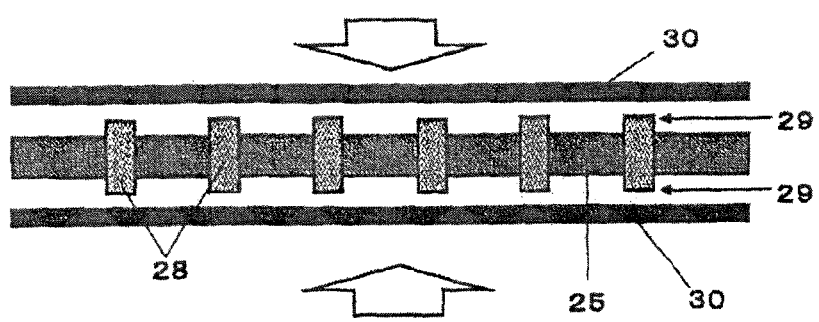
FIG. 5A illustrates a schematic cross-sectional view describing a step subsequent to the step of FIG. 4D in the method for manufacturing the multilayer wiring board.
Figure 5B:
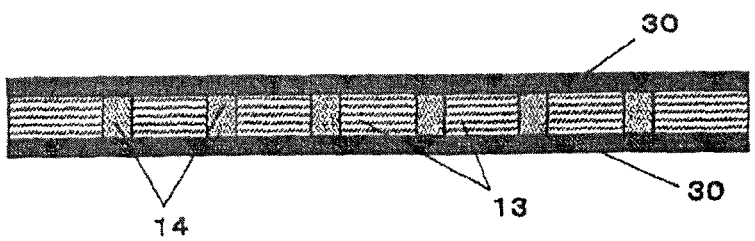
FIG. 5B illustrates a schematic cross-sectional view describing a step subsequent to the step of FIG. 5A in the method for manufacturing the multilayer wiring board.

Next, sheets of Cu foil 30 are placed on the prepreg 25 and pressed in directions indicated by arrows, as shown in FIG. 5A. As a result, the prepreg 25 and the sheets of Cu foil 30 are integrated, as shown in FIG. 5B. In this case, force is applied to the protrusions 29 via the sheets of copper foil 30 at the beginning of pressing, so that the via paste 28 applied in the through-holes of the prepreg 25 are compressed under high pressure. As a result, gaps between the Cu particles 17 included in the via paste 28 are narrowed, so that the Cu particles 17 are brought into plane contact with one another.

The pressing condition is not specifically limited but a preferred condition is such that the die temperature is set within the range from room temperature (20° C.) to less than the melting point of the Sn—Bi based solder particles. Also, to promote curing of the prepreg, this pressing step may use a hot press heated to a temperature necessary to promote the curing.

The compression of the via paste 28 with the protrusions 29, which is applied to fill in the through-holes of the prepreg 25, will now be described in detail with reference to FIGS. 7A and 7B.

Figure 7A:
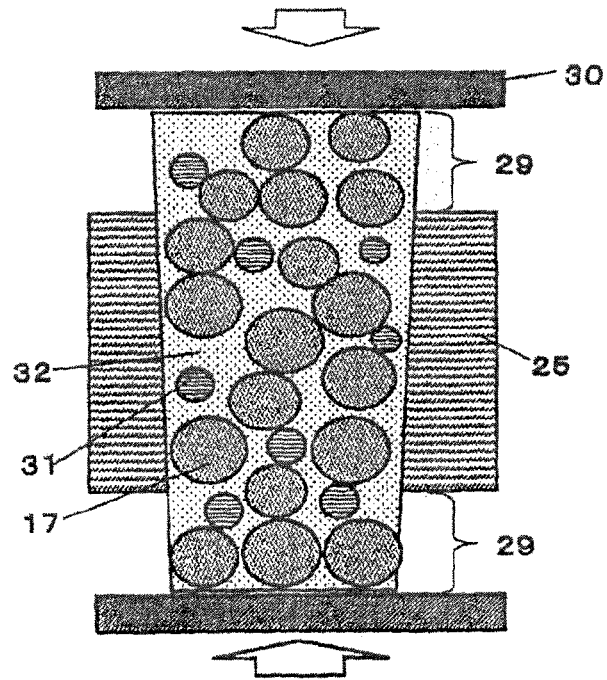
FIG. 7A is a schematic cross-sectional view illustrating a through-hole in a prepreg, which is filled with via paste, in the embodiment.
Figure 7B:
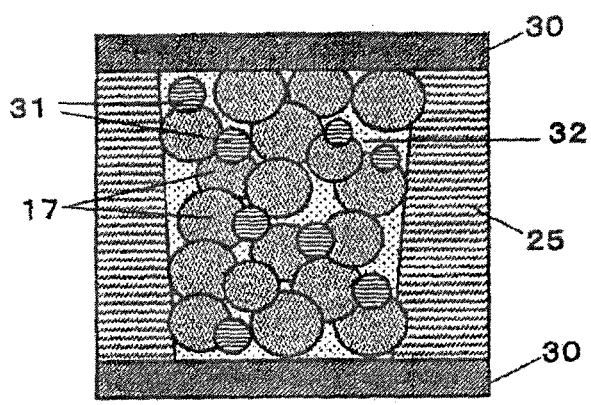
FIG. 7B is a schematic cross-sectional view illustrating a state where the via paste applied in the through-hole of FIG. 7A is compressed in the embodiment.

FIGS. 7A and 7B are schematic cross-sectional views around a through-hole in the prepreg 25, which is filled with the via paste 28. FIGS. 7A and 7B illustrate pre-compression and post-compression respectively.

The protrusions 29 projecting from the through-hole provided in the prepreg 25 are pressed via the sheets of Cu foil 30, as shown in FIG. 7A, so that the via paste 28 applied in the through-hole is compressed, as shown in FIG. 7B. Pressure application for the compression causes a curable resin component 32 to partially permeate into the prepreg 25. Consequently, Cu particles 17 and Sn—Bi based solder particles 31, which are applied in the through-hole 27, increase in density.

Such highly dense Cu particles 17 contact one another. At the beginning of the compression, the Cu particles 17 are brought into point contact with one another, and then the point contact portions are deformed and expanded as the pressure increases, so that they are brought into plane contact with one another. In this manner, a number of Cu particles 17 are brought into plane contact with one another, electrically connecting upper- and lower-layer wirings 12a and 12b with low resistance. Specifically, this step allows formation of portions where the Cu particles 17 are in contact with one another without their entire surfaces being covered by the Sn—Bi based solder particles 31. Accordingly, conduction paths to be formed are reduced in electrical resistance, and by melting the Sn—Bi based solder particles 31 in a subsequent heating process, the first metal regions 18 can be provided to cover and extend over the surfaces of the contact portions 20 where the Cu particles are in contact with one another, thereby forming highly flexible conduction paths.

Next, after the compression, the via paste 28 is heated to a temperature greater than or equal to the melting point of the Sn—Bi based solder particles 31. The heating melts the Sn—Bi based solder particles 31. Also, the first metal regions 18 mainly composed of tin, a tin-copper alloy, and/or a tin-copper intermetallic compound are formed around the Cu particles 17. In this case, the first metal regions 18 cover and extend over the portions in which the Cu particles 17 are in plane contact with one another. Specifically, the contact between the Cu particles 17 and the molten Sn—Bi based solder particles 31 results in reaction of Cu in the Cu particles 17 with Sn in the Sn—Bi based solder particles 31, thereby forming the first metal regions 18 mainly composed of an intermetallic compound which includes $Cu_6Sn_5$ or $Cu_3Sn$, or a tin-copper alloy. On the other hand, Bi still remaining in the Sn—Bi based solder particles 31 is precipitated independently of Sn, thereby forming the second metal regions 19 mainly composed of bismuth (Bi).

Well-known solder materials that are molten in a relatively low-temperature range are, for example, Sn—Pb based solder, Sn—In solder, and Sn—Bi based solder. Among these materials, In is expensive, and Pb is considered to have high environmental impact.

Also, the melting point of the Sn-58Bi based solder is less than or equal to 140° C., which is lower than a general solder reflow temperature for surface mounting of electronic components. Accordingly, in the case where the Sn-58Bi based solder is used alone for via-hole conductors of a circuit board, the solder in the via-hole conductors might be remelted at the time of solder reflow, resulting in varied via resistance. On the other hand, in the case where the via paste of the present embodiment is used, Sn in the Sn-58Bi based solder particles reacts with the surfaces of the Cu particles, resulting in reduced Sn concentration in the Sn-58Bi based solder particles, and furthermore, a heating and cooling step causes Bi precipitation, resulting in a Bi phase. In addition, such precipitation and presence of the Bi phase makes it difficult for the via-hole conductor solder to be remelted even if it is subjected to solder reflow. As a result, even after solder reflow, varied resistance is unlikely to occur.

The temperature at which to heat the compressed via paste 28 is not specifically limited so long as it is greater than or equal to the melting point of the Sn—Bi based solder particles 31 within such a range as not to resolve the components of the prepreg 25. Concretely, for example, in the case where Sn-58Bi particulate solder is used as Sn—Bi based solder particles, the temperature is preferably in the range from approximately 150 to 250° C., more preferably, from approximately 160 to 230° C. Note that in this case, appropriate temperature selection makes it possible to harden a curable resin component included in the via paste 28.

In this manner, via-hole conductors are formed for interlayer connection of upper- and lower-layer wirings 12a and 12b.

In the present embodiment, it is necessary for the metal component included in the via paste 28 to include Cu particles at such a content ratio as to accord with the weight ratio of Cu and Sn (Cu/Sn) in the range of from 1.59 to 21.43. The reason for this will be described below.

Figure 3:
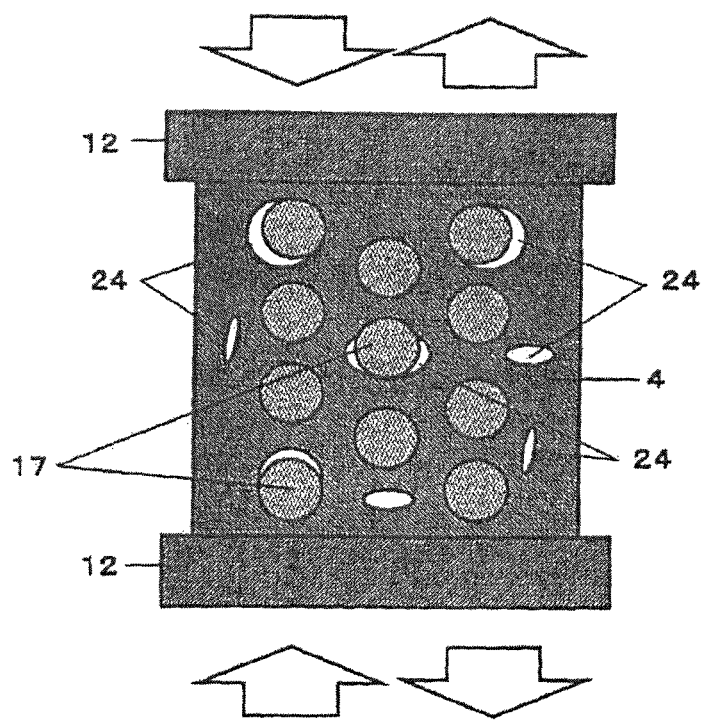
FIG. 3 is a schematic cross-sectional view illustrating an exemplary via-hole conductor where Cu/Sn is less than 1.59.

FIG. 3 is a schematic cross-sectional view illustrating an exemplary via-hole conductor where Cu/Sn is less than 1.59.

As shown in FIG. 3, when the ratio Cu/Sn is less than 1.59, the proportion of Cu in the via-hole conductor is small, which makes it difficult for a number of Cu particles 17 to be in contact with one another, so that the Cu particles 17 tend to be dotted within a matrix made of the metal compound 4. In this case, the Cu particles 17 are tightly bound by the hard intermetallic compound 4, and therefore the via-hole conductors themselves are in a hardened state without springiness. When compared to the Cu particles 17, the intermetallic compound 4, such as $Cu_6Sn_5$ or $Cu_3Sn$, is hard and resistant to deformation. According to the study of the inventors, the Vickers hardness of $Cu_6Sn_5$ and $Cu_3Sn$ is about 378 $Kg/mm^2$ and about 343 $Kg/mm^2$, respectively, which are significantly higher than 117 $Kg/mm^2$ for Cu.

Furthermore, the Cu particles 17 and the intermetallic compound 4 have their respective different thermal expansion coefficients, and therefore internal stress occurs at the time of solder reflow due to the difference in the thermal expansion coefficient, so that cracks and voids 24 readily occur.

Also, when the weight ratio Cu/Sn is less than 1.59, voids more readily occur. A major factor in such occurrence of voids is contact diffusion of Sn and Cu, as typified by Kirkendall voids caused by the Kirkendall effect. Kirkendall voids readily occur at interfaces between Cu-particle surfaces and Sn or an alloy including such Sn applied to fill gaps in the Cu particles.

When there are voids and cracks at interfaces between the Cu particles 17 and the intermetallic compound 4, as shown in FIG. 3, the voids and cracks tend to propagate and widen. Kirkendall voids, if they occur, tend to propagate and widen as well. In particular, when the via-hole conductors are small in diameter, the cracks and voids are apt to cause cohesive failure of the intermetallic compounds 4 and furthermore breakage of the via-hole conductors.

Moreover, when such cohesive failure or interfacial failure occurs inside the via-hole conductors, electrical resistance increases in their via portions, adversely affecting the reliability of the via portions.

Now, the case where the ratio Cu/Sn is greater than or equal to 1.59 will be schematically described with reference to FIGS. 1B and 2.

When the ratio Cu/Sn is greater than or equal to 1.59, the first metal regions 18 included in the metal portions 15 are present so as to physically protect the portions in which a number of Cu particles 17 are in contact with one another, as shown in FIG. 1B. The arrows 22a and 22b shown in FIG. 2 indicate external force applied to the via-hole conductor and internal stress generated in the via-hole conductor. When external force as indicated by the arrows 22a or the internal stress 22b occurs to the via-hole conductor, the flexible Cu particles 17 are deformed to relax the force. In addition, even if the first metal regions 18 are cracked, conduction paths formed by a number of Cu particles 17 in contact with one another are maintained, so that electrical characteristics and reliability are not significantly affected. Note that the entire metal portions 15 are resiliently protected by the curable resin component 16, as shown in FIG. 1B, and therefore deformation is further suppressed to a certain extent. Thus, it is unlikely that cohesive failure or interfacial failure occurs.

Also, when Cu/Sn is greater than or equal to 1.59, the first metal regions are formed on the surfaces of Cu particles so as to extend over their contact portions. That is, when Cu/Sn is greater than or equal to 1.59, Kirkendall voids are more likely to occur in the first metal regions that cover around and extend over the contact portions of the Cu particles, rather than within or at the interfaces of the Sn—Bi based solder particles applied in the gaps between the Cu particles. Kirkendall voids, when generated in the first metal regions, are unlikely to affect the reliability and electrical characteristics of the via-hole conductors. This is because sufficient electrical continuity is maintained by the Cu particles in plane contact with one another.

Figure 5C:
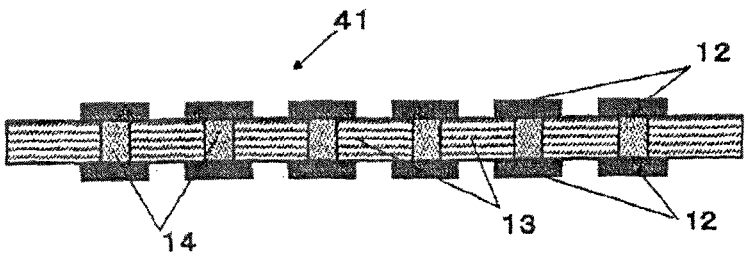
FIG. 5C illustrates a schematic cross-sectional view describing a step subsequent to the step of FIG. 5B in the method for manufacturing the multilayer wiring board.

Next, wirings 12 are formed as shown in FIG. 5C. The wiring 12 is formed, for example, by forming a photoresist film on the surface of the sheet of Cu foil 30 affixed to the surface layer, developing the film after patterning them by selective exposure through a photomask, selectively removing the Cu foil by etching except for wiring portions, and thereafter removing the photoresist film. For the formation of the photoresist film, liquid resists or dry films may be used.

Such a step results in a wiring board 41 with circuits formed on its opposite surfaces, in which the upper-layer wiring 12a and the lower-layer wiring 12b are in interlayer connection via the via-hole conductors 14. By further multilayering of such a wiring board 41, a multilayer wiring board 11, in which circuits in multiple layers are in interlayer connection, is obtained. The method for multilayering of the wiring board 41 will be described with reference to FIGS. 6A to 6C.

Figure 6A:
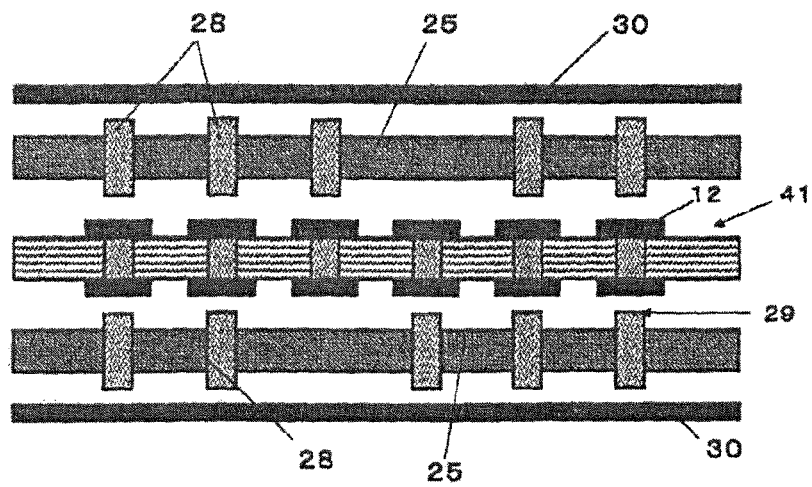
FIG. 6A illustrates a schematic cross-sectional view describing a step in multilayering of a wiring board.
Figure 6B:
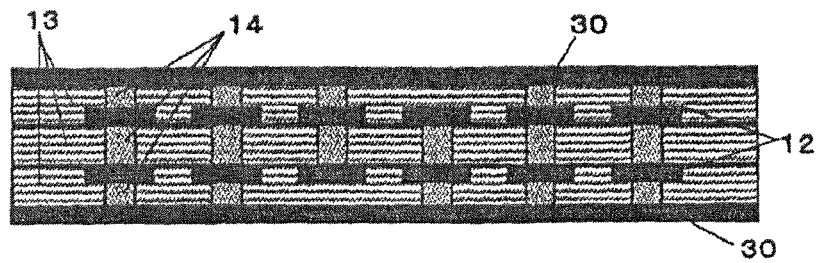
FIG. 6B illustrates a schematic cross-sectional view describing a step subsequent to the step of FIG. 6A in multilayering of the wiring board.
Figure 6C:
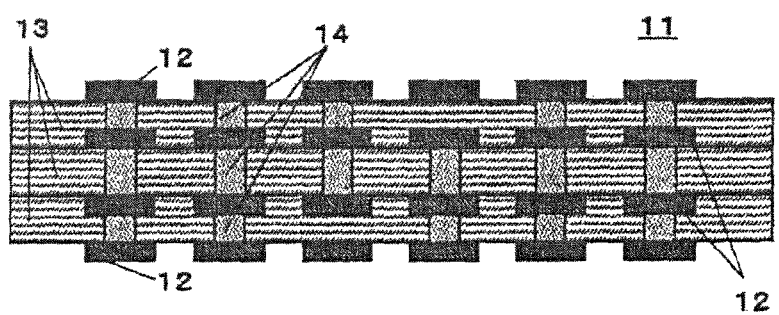
FIG. 6C illustrates a schematic cross-sectional view describing a step subsequent to the step of FIG. 6B in multilayering of the wiring board.

Initially, as shown in FIG. 6A, prepregs 25 with protrusions 29 made of via paste 28 similar to that obtained in FIG. 4D are placed on the opposite surfaces of the wiring board 41 obtained as described above. Then, a sheet of Cu foil 30 is placed on the outer surface of each prepreg 25, thereby forming a stacked structure. Next, the stacked structure is sandwiched in a pressing die and then pressed and heated under the aforementioned conditions, resulting in a laminate as shown in FIG. 6B. Thereafter, new wirings 42 are formed by photo processing as described above. In this manner, further multilayering can be achieved. By repeating such a multilayering process, it is possible to stack still more layers.

Next, the present invention will be described more specifically by way of example. Note that the contents of the example are not to be in any way construed as limiting the scope of the present invention.

EXAMPLE

First, raw materials used in the present example are described together below.

Cu particles: 1100Y manufactured by Mitsui Mining & Smelting Co., Ltd. with an average particle diameter of 5 µm.
Sn—Bi based solder particles: Sn42-Bi58 with an average particle diameter of 5 µm and a melting point of 138° C., manufactured by Yamaishi Metal Co., Ltd.
Epoxy resin: jeR871 manufactured by Japan Epoxy Resin K.K.
Curing agent 1: 2-methylaminoethanol with a boiling point of 160° C., manufactured by Nippon Nyukazai Co., Ltd.
Curing agent 2: amine-adduct curing agent (solid) with a melting point of from 120 to 140° C., manufactured by Ajinomoto Fine-Techno Co., Inc.
Curing agent 3: 2,2'-dimethylaminoethanol with a boiling point of 135° C.
Prepreg: glass fiber base material of 500 mm×500 mm×100 µm in length×width×thickness impregnated with epoxy resin.
Protective film: 25 µm-thick PET sheet.
Copper foil (25 µm thick).

(Via Paste Preparation)

A blend of Cu particles, Sn—Bi based solder particles, epoxy resin, and a curing agent at a blend ratio shown in Table 1 was mixed by a planetary mixer to prepare via paste.

(Wiring Board Manufacturing)

Protective films were attached to opposite surfaces of the prepreg. Then, the prepreg with the protective films attached thereon was perforated from outside by a laser with 100 or more holes having a diameter of 150 µm.

Subsequently, the prepared via paste was applied to completely fill the through-holes. Then, the protective films on the opposite surfaces were removed to reveal protrusions formed by the via paste partially projecting from the through-holes.

Next, sheets of copper foil were placed on the opposite surfaces of the prepreg so as to cover the protrusions. Then, the prepreg with the copper foil placed thereon was mounted on a lower die of a hot-pressing die pair via exfoliate paper, heated from a room temperature of 25° C. to a maximum temperature of 220° C. for 60 minutes, kept at 220° C. for 60 minutes, and then cooled to room temperature for 60 minutes. Note that exerted pressure was 3 MPa.

(Evaluation)

<Resistance Test>

One hundred via-hole conductors formed in each of the wiring boards were measured for resistance by a four-terminal method. Then, average and maximum resistance values were obtained for the one hundred. Note that maximum resistance values less than 2 mΩ were determined as "A", maximum resistance values from 2 to 3 mΩ as "B", and maximum resistance values greater than 3 mΩ as "C". Note that when the maximum resistance values are low, a standard deviation α of the resistance values is likely to be low as well.

<Delamination Test>

Adhesion of the via-hole conductors was examined by delaminating (or breaking) the copper foil from the surfaces of the obtained wiring boards. In this case, unsuccessful delamination was determined as "A", difficult but successful delamination as "B", and easy delamination as C.

<Initial Resistance>

Combined connection resistance for one hundred via holes provided in each of the wiring boards were measured by a four-terminal method. Note that they were determined as "A" when their initial resistance values were less than or equal to 1Ω, "B" when those with initial resistance values less than or equal to 1Ω and those with initial resistance values greater than 1Ω were both present, and "C" when all their initial resistance values were greater than 1Ω.

<Connection Reliability>

The wiring boards measured for initial resistance were subjected to a temperature cycling test for 500 cycles, and those with the percentage of change from the initial resistance being 10% or less and those with the percentage of change of greater than 10% were determined as "A" and "B", respectively.

The results are shown in Table 1. Also, average resistance values versus Cu/Sn mass ratio are plotted as a graph shown in FIG. 8.

TABLE 1

| | | Paste No. | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Compositions (parts by mass) | Cu Particles | 100 | 100 | 90 | 80 | 65.5 | 60 | 55.8 | 55.8 | 55.8 | 40 | 20 | 0 |
| | Sn42—58Bi Particles | 0 | 0 | 10 | 20 | 34.5 | 40 | 44.2 | 44.2 | 44.2 | 60 | 80 | 100 |
| | Epoxy Resin | 10 | 10 | 10 | 10 | 10 | 10 | 10 | 10 | 10 | 10 | 10 | 10 |
| | Curing Agent 1 2-methylaminoethanol | 2 | — | 2 | 2 | 2 | 2 | 2 | — | — | 2 | 2 | 2 |
| | Curing Agent 2 amine-adduct curing agent | — | 2 | — | — | — | — | — | — | — | — | — | — |
| | Curing Agent 3 2-diisopropanolamine | — | — | — | — | — | — | — | 2 | — | — | — | — |
| | Curing Agent 4 2,2'-dimethylaminoethanol | — | — | — | — | — | — | — | — | 2 | — | — | — |
| Cu/Sn | | — | — | 21.43 | 9.52 | 4.52 | 3.57 | 3 | 3 | 3 | 1.59 | 0.60 | 0 |
| Evaluation Results | Ave. Resistance (1via mΩ) | 0.93 | 0.95 | 0.94 | 0.98 | 1.18 | 1.28 | 1.30 | 1.32 | 1.42 | 2.26 | 3.39 | 4.42 |
| | Max. Resistance (mΩ) | 1.30 | 1.40 | 1.30 | 1.35 | 1.55 | 1.67 | 1.80 | 1.80 | 1.90 | 2.96 | 4.20 | 5.66 |
| | Resistance Determination | A | A | A | A | A | A | A | A | A | B | C | C |
| | Delamination Test | C | C | B | B | A | A | A | A | A | A | A | A |
| | Initial Resistance | A | A | A | A | A | A | A | A | A | B | C | C |
| | Connection Reliability | B | B | A | A | A | A | A | A | B | A | A | A |

Figure 8:
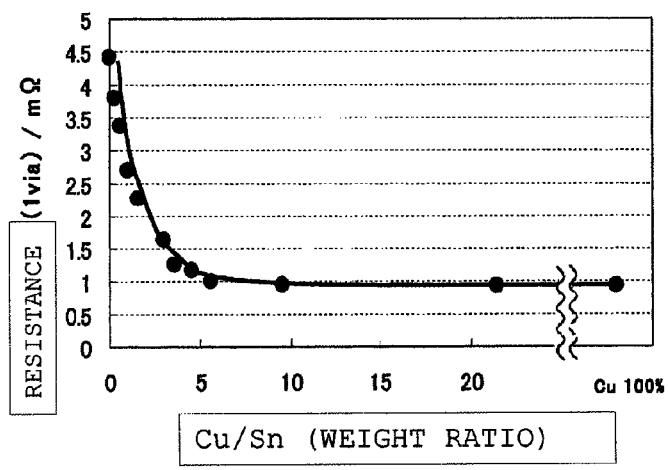
FIG. 8 is a graph showing resistance values (1 via/mΩ) versus the weight ratio Cu/Sn in via-hole conductors obtained by way of example.

From the graph of FIG. 8, it can be appreciated that the resistance value abruptly drops approximately the weight ratio Cu/Sn from 1.59, and also drops approximately from 3. This is possibly because the rate of contact between Cu particles rises as the proportion of Cu particles 17 increases. Specifically, it is possibly because less metal with higher resistance than Cu intervenes between adjacent Cu particles 17.

In other words, for Cu/Sn of less than 1.59, the resistance value abruptly increases, possibly because metal with high resistance intervenes between a number of Cu particles 17.

It can be also appreciated from Table 1 that both the average and maximum resistance values fall to as extremely low as 3 mΩ or less when the proportion of Sn42-58Bi particles is 60% by mass or less and also 2 mΩ or less for 44.2% by mass or less of Sn42-58Bi particles. However, it can be seen that delamination readily occurs when no Sn42-58Bi particles are contained. On the other hand, it is obvious that delamination becomes unlikely to occur as the proportion of Sn42-58Bi particles increases.

It can also be appreciated that low resistance and high reliability are compatible when the proportion of Sn42-58Bi particles is in the range from 10 to 60% by mass. When the proportion of Sn42-58Bi particles is excessively low, there is a reduction in first metal regions around contact portions where Cu particles are in plane contact with one another, resulting in insufficient connection reliability. On the other hand, when the proportion of Sn42-58Bi particles is excessively high, the first metal regions increase, which reduces the contact portions where Cu particles are in contact with one another, resulting in a tendency toward higher resistance.

When comparing the multilayer wiring boards obtained using paste Nos. 7 to 9, it can also be appreciated that paste Nos. 7 and 8 with the boiling points of their curing agents being higher than the melting point of 138° C. of Sn42-58Bi particles are more superior in the balance between reduction in the resistance value and increase in the reliability. When the boiling point is lower, an oxidized layer on the solder surface is decreased, so that the curing agent starts volatilization before melting, and therefore the area of its metal portion is reduced, causing a problem with the connection reliability of via holes. Note that the boiling point of the curing agent is desirably 300° C. or less. When it is higher than 300° C., a particular kind of curing agent is required and furthermore its reactivity might be adversely affected.

Figure 9A:
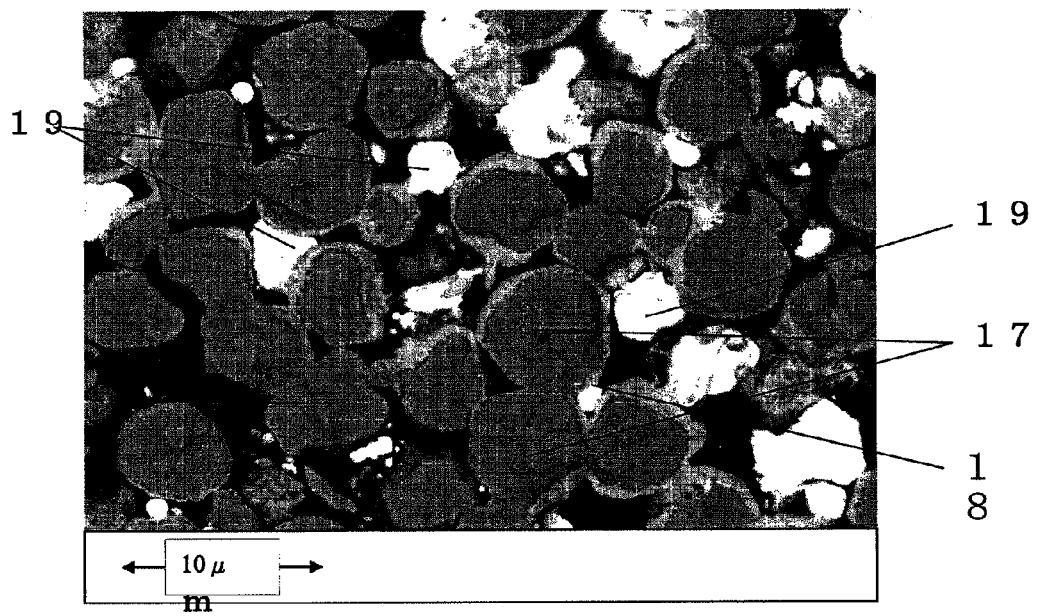
FIG. 9A shows a cross-sectional scanning electron microscope (SEM) photograph of a via conductor of a multilayer wiring board obtained by way of example at 3000-times magnification.
Figure 9B:
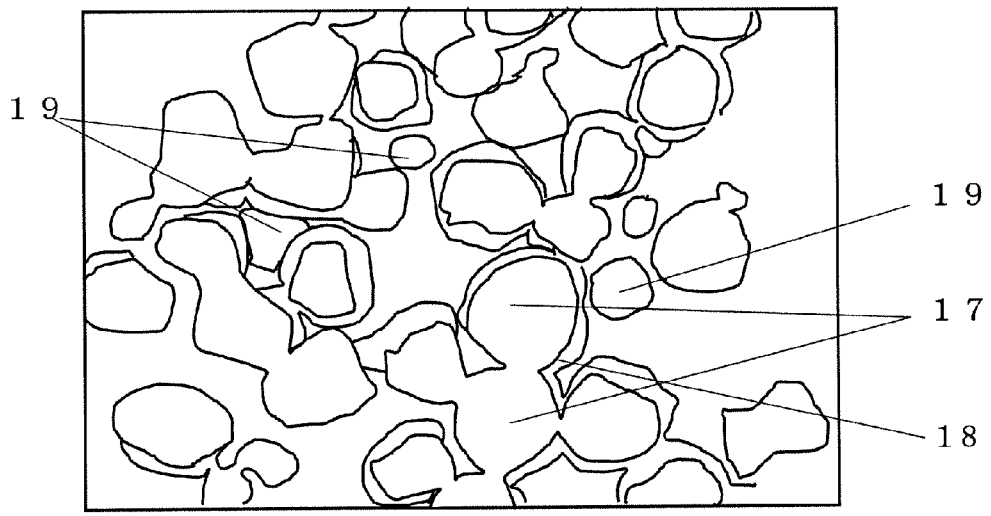
FIG. 9B shows a tracing of the SEM photograph of FIG. 9A.
Figure 10A:
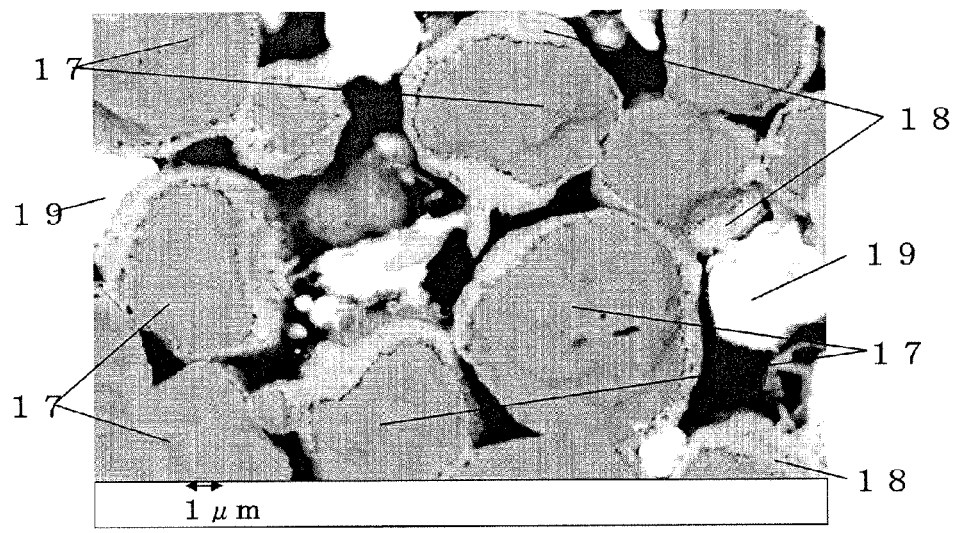
FIG. 10A shows a cross-sectional SEM photograph of the via conductor of the multilayer wiring board obtained by way of example at 6000-times magnification.
Figure 10B:
FIG. 10B shows a tracing of the SEM photograph of FIG. 10A.

Here, FIGS. 9A and 10A illustrate representative cross-sectional scanning electron microscope (SEM) photographs of a via conductor in the multilayer wiring board obtained using paste No. 6 according to the present invention, and FIGS. 9B and 10B illustrate their tracings. Note that FIGS. 9A and 10A show 3000- and 6000-times magnification, respectively. Also, FIG. 11A illustrates a cross-sectional via conductor image used for an EPMA (electron probe microanalyzer) and FIG. 11B illustrates a tracing thereof.

It can be seen from the figures that the obtained via-hole conductor is highly filled with a number of Cu particles 17, which are in plane contact with one another. Accordingly, it can be appreciated that a low-resistance conduction path is formed. It can be also appreciated that first metal regions 18 mainly composed of tin (Sn), a tin-copper intermetallic compound, or a tin-copper alloy are formed in portions where the Cu particles 17 are in plane contact with one another, so as to extend over such contact portions. Moreover, it is obvious that second metal regions 19 mainly composed of Bi with high resistance are substantially out of contact with the Cu particles. In the second metal regions, a high concentration of Bi precipitates, possibly because Sn in the Sn42-58Bi particles form an alloy (e.g., an intermetallic compound) in concert with Cu on the surfaces of the Cu particles 17.

Figure 11A:
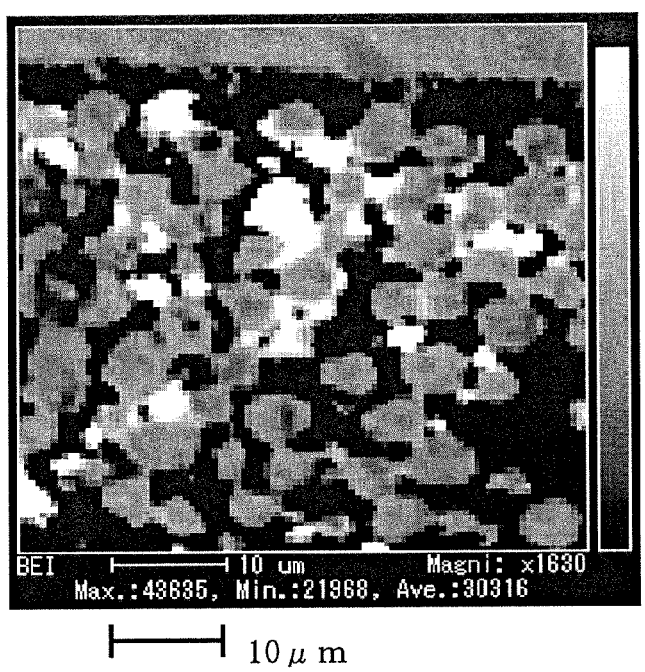
FIG. 11A shows a cross-sectional SEM photograph of the via conductor of the multilayer wiring board obtained by way of example.
Figure 11B:
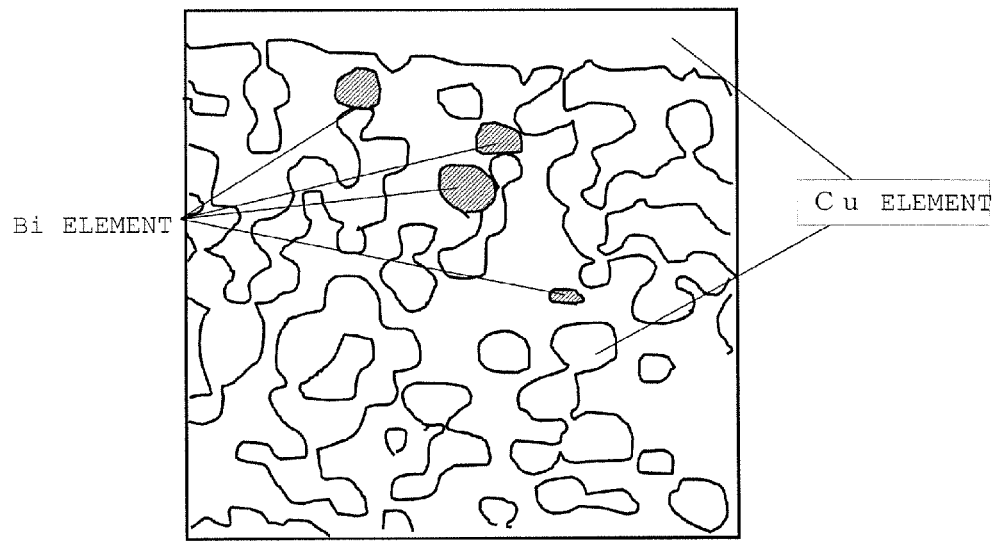
FIG. 11B shows a tracing of the SEM photograph of FIG. 11A.
Figure 12A:
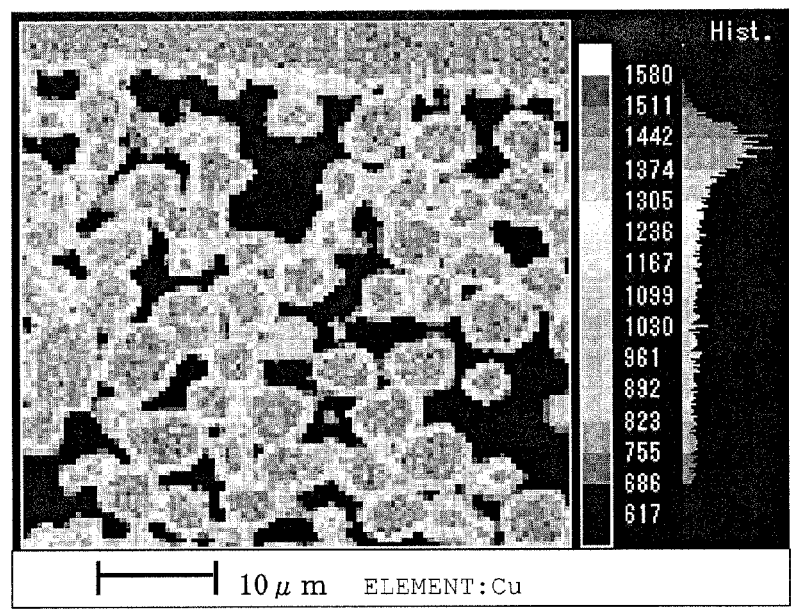
FIG. 12A shows an image obtained by Cu-element mapping from the SEM image of FIG. 11A.
Figure 12B:
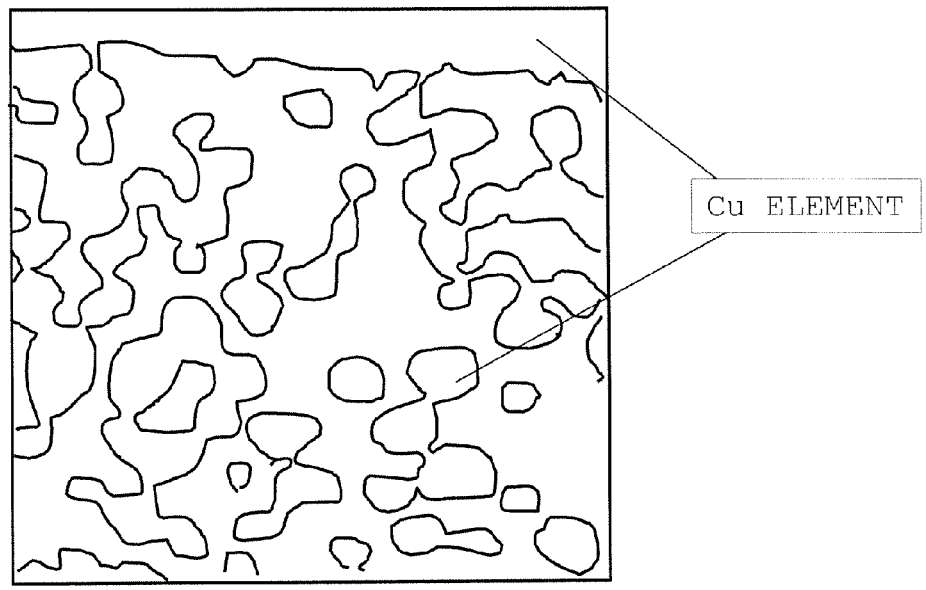
FIG. 12B shows a tracing of the mapping image of FIG. 12A.

FIG. 12A shows an image obtained by the EPMA performing Cu-element mapping from the SEM image of FIG. 11A, and FIG. 12B shows a tracing thereof.

From FIGS. 12A and 12B, it can be appreciated that the obtained via-hole conductor has a number of Cu particles randomly present in high density. It can be also appreciated that the Cu particles are in direct contact with one another to establish electrical connection.

Figure 13A:
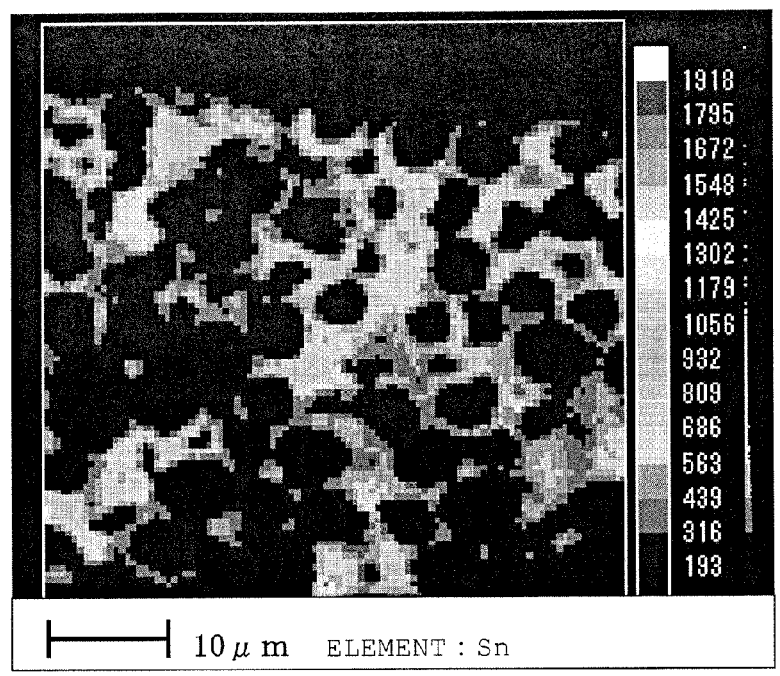
FIG. 13A shows an image obtained by Sn-element mapping from the SEM image of FIG. 11A.
Figure 13B:
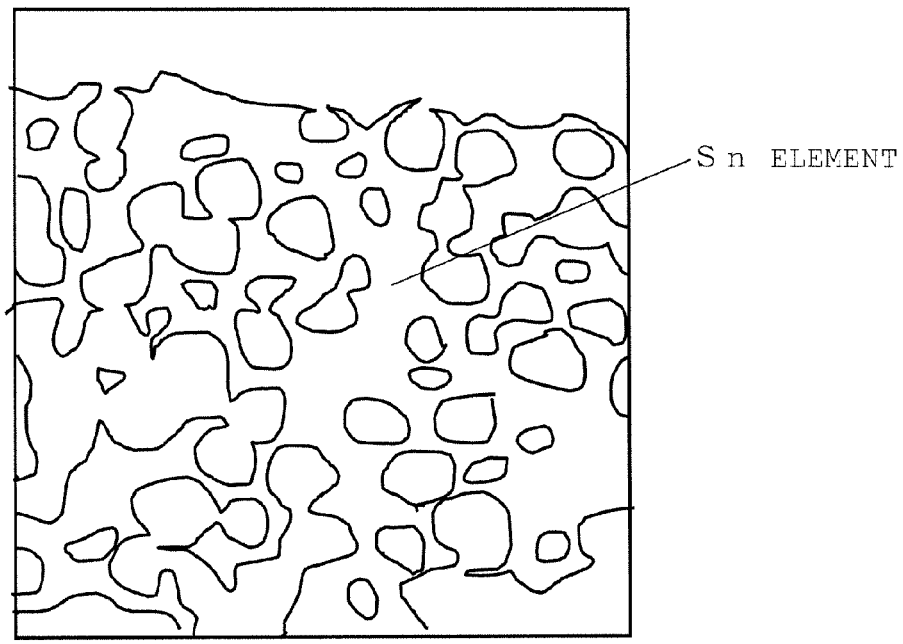
FIG. 13B shows a tracing of the mapping image of FIG. 13A.

FIG. 13A shows an image obtained by Sn-element mapping based on the image of FIG. 11A, and FIG. 13B shows a tracing thereof.

From FIGS. 13A and 13B, it can be appreciated that contact portions, in which a number of Cu particles are in direct contact with one another, have first metal regions 18 formed thereon so as to extend over the contact portions.

Note that in FIGS. 13A and 13B, the Cu particles are shown as if most of their surfaces were covered by the first metal regions. However, in the EPMA image, epoxy resin is transparent and therefore not only Sn elements in the surface layer to be observed but also Sn elements in the backing layer are detected. Accordingly, in fact, rather than covering most of the surfaces of the Cu particles, the first metal regions are present extending over the contact portions. This can be seen also from the SEM images shown in FIGS. 9A to 11A. Also, in such a structure, stress generated in the relatively hard first metal regions is absorbed by soft Cu particles. Therefore, cracks generated in the first metal regions are inhibited from propagating and widening.

Figure 14A:
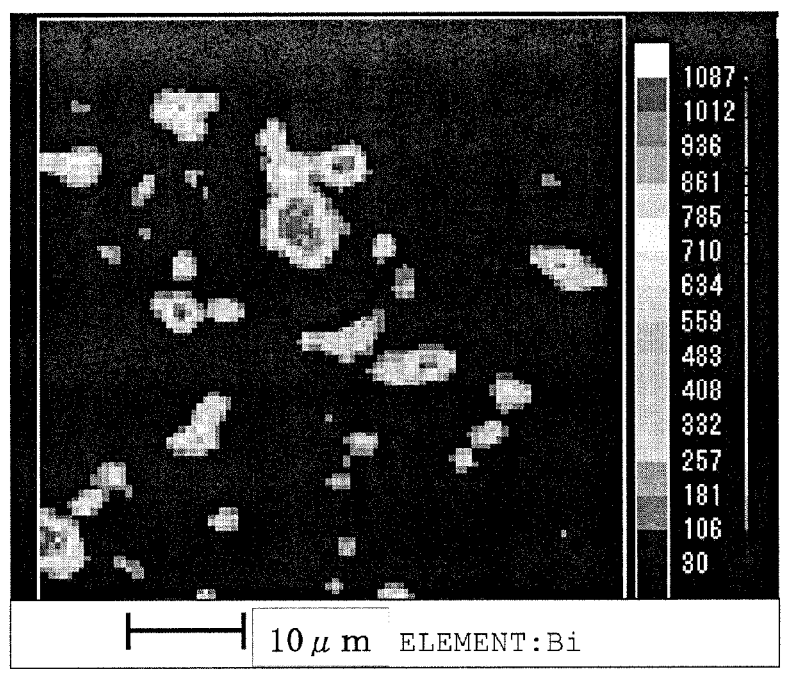
FIG. 14A shows an image obtained by Bi-element mapping from the SEM image of FIG. 11A.
Figure 14B:
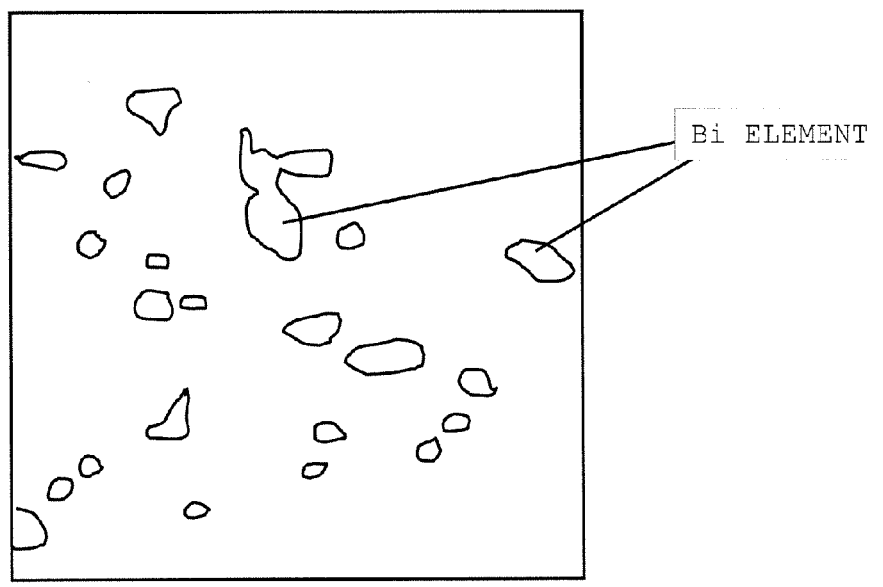
FIG. 14B shows a tracing of the mapping image of FIG. 14A.
Figure 15:
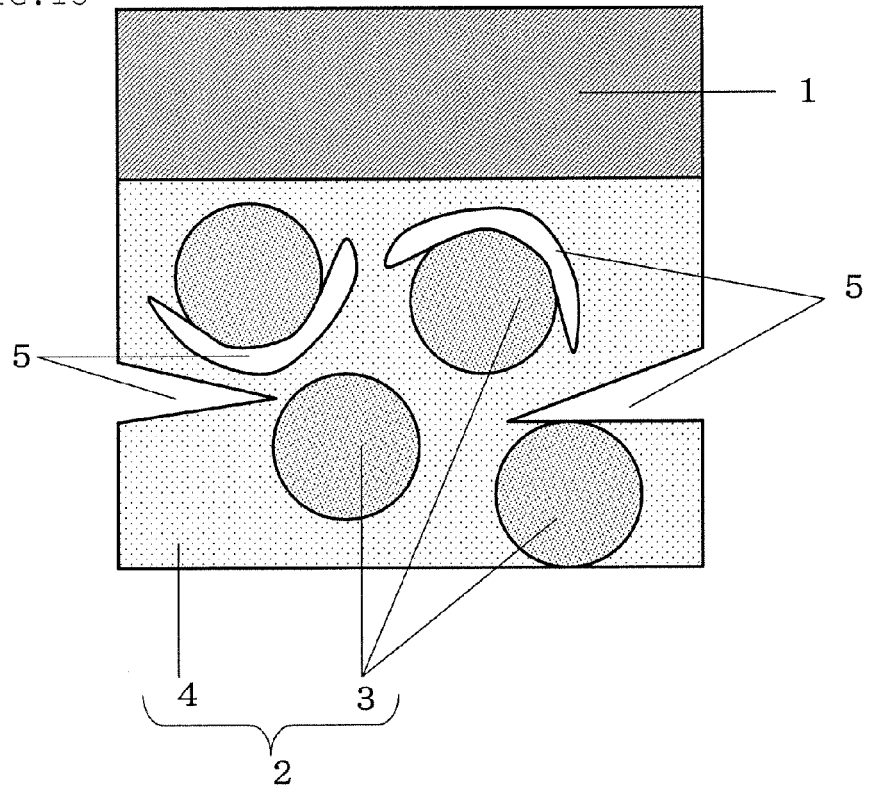
FIG. 15 is a schematic cross-sectional view describing a cross section of a conventional via-hole conductor.

FIG. 14A shows an image obtained by Bi-element mapping based on the image of FIG. 11A, and FIG. 14B shows a tracing thereof.

From FIGS. 14A and 14B, it can be seen that Bi is present so as to cause second metal regions not to contact Cu particles. From this, it can be appreciated that Bi with high resistance does not affect the conduction path formed by the Cu particles in contact with one another.

INDUSTRIAL APPLICABILITY

The present invention makes it possible to further reduce the cost and size of multilayer wiring boards for use in, for example, cell phones, and also further enhance their functionality and reliability. Furthermore, optimal via pastes are proposed in view of reduction in diameter of vias and formation of via paste reaction products, which also contributes to the size reduction and the reliability enhancement of the multilayer wiring boards.

The invention claimed is:

1. A wiring board comprising an insulating resin layer, a plurality of wirings laid via the insulating resin layer, and at least one via-hole conductor provided in a through-hole and configured to pierce the insulating resin layer for electrically connecting the wirings, wherein
   the via-hole conductor includes metal and resin portions, and the resin portion forms a matrix in which the metal portion is embedded, the metal portion including at least copper, tin, and Bi, and have a weight ratio (Cu/Sn) of Cu to Sn in the metal portions in the range from 1.59 to 21.43,
   the metal portion comprises three metal regions, including copper regions made of copper (Cu) particles, first metal regions, and second metal regions,
   the copper particles are in contact with one another via plane contact portions, thereby electrically connecting the wirings,
   the first metal regions are mainly composed of tin (Sn), a tin-copper alloy, and/or a tin-copper intermetallic compound, with at least part thereof covering around and extending over the plane contact portions of the copper particles,
   the second metal regions are mainly composed of bismuth (Bi), and
   the at least one via-hole conductor is sandwiched between a pair of the plurality of wirings, each of the pair of wirings at least partially covers either a top end or a bottom end of the through-hole.

2. The wiring board according to claim 1, wherein the second metal regions are out of contact with the copper particles in the metal portions.

3. The wiring board according to claim 1, wherein the volume percent of the copper particles in the via-hole conductor is in the range from 30 to 90%.

4. The wiring board according to claim 1, wherein the copper region is a joined unit comprised of the copper particles, and wherein the joined unit is configured to deform when force is applied to said joined unit.

5. The wiring board according to claim 1, wherein the copper particles are in contact with the pair of wirings via plane contact portions.

6. A wiring board manufacturing method comprising:
   a through-hole formation step of forming at least one through-hole by perforating an uncured or semi-cured prepreg covered by protective films from outside either of the protective films;
   a filling step of filling the through-hole with via paste;
   a protrusion step of removing the protective films after the filling step, thereby revealing protrusions formed by the via paste partially projecting from the through-hole;
   a placement step of placing sheets of metal foil on surfaces of the prepreg so as to cover the protrusions;
   a compression-bonding step of subjecting the metal foil to compression bonding onto the surfaces of the prepreg; and
   a heating step of performing heating at a predetermined temperature after the compression-bonding step, wherein,
   the via paste includes Cu particles, Sn—Bi based solder particles, and thermally curable resin, and has a weight ratio (Cu/Sn) of Cu to Sn in the range from 1.59 to 21.43,
   in the compression-bonding step, the via paste is compressed by way of the protrusions to bring the Cu particles into plane contact with one another, thereby electrically connecting the sheets of metal foil,
   in the heating step, the compressed via paste is heated to a melting point of the Sn—Bi based solder particles or higher, thereby causing the Sn—Bi based solder particles to cover around and extend over the plane contact portions, and
   thereafter, generating a Cu—Sn compound so as to cover around and extend over the plane contact portions and Bi phase so as to contact with the Cu—Sn compound.

7. The wiring board manufacturing method according to claim 6, wherein the thermally curable resin is epoxy resin.

8. The wiring board manufacturing method according to claim 7, wherein the epoxy resin contains a curing agent which is an amine based compound having at least one or more hydroxyl groups in its molecules.

9. The wiring board manufacturing method according to claim 8, wherein the amine based compound has a boiling point greater than or equal to the melting point of the Sn—Bi based solder particles, the boiling point being 300° C. or lower.

10. The wiring board manufacturing method according to claim 6, wherein the copper particles in the compression-bonding step form a joined unit configured to deform when force is applied to said joined unit.

11. Via paste for manufacturing a wiring board, wherein,
    the wiring board includes an insulating resin layer, a plurality of wirings laid via the insulating resin layer, and at least one via-hole conductor provided in a through-hole and configured to pierce the insulating resin layer for electrically connecting the wirings,
    the via-hole conductor includes metal and resin portions, and the resin portion forms a matrix in which the metal portion is embedded, the metal portion including at least copper, tin, and Bi, the metal portion comprises three metal regions, including copper regions made of copper (Cu) particles, first metal regions, and second metal regions, the copper particles are in contact with one another via plane contact portions, thereby electrically connecting the wirings, the first metal regions are mainly composed of tin (Sn), a tin-copper alloy, and/or a tin-copper intermetallic compound, with at least part thereof covering around and extending over the plane contact portions of the copper particles, the second metal regions are mainly composed of bismuth (Bi), the via paste includes Cu particles, Sn—Bi based solder particles, and thermally curable resin, and has a content ratio of the Cu particles of 55.8 to 65.5% by mass, of a total amount of the Cu particles and the Sn—Bi based solder particles and a weight ratio (Cu/Sn) of Cu to Sn in the range from 1.59 to 21.43, and the at least one via-hole conductor is sandwiched between a pair of the plurality of wirings, each of the pair of wirings at least partially covers either a top end or a bottom end of the through-hole.

12. The via paste according to claim 11, wherein the content ratio of Cu particles and the content ratio of Sn—Bi based solder particles are 40 to 90% by mass and 10 to 60% by mass, respectively, of a total amount of the Cu particles and the Sn—Bi based solder particles.

13. The via paste according to claim 11, wherein the thermally curable resin is epoxy resin.

14. The via paste according to claim 13, wherein the epoxy resin contains a curing agent which is an amine based compound having at least one or more hydroxyl groups in its molecules.

15. The via paste according to claim 14, wherein the amine compound has a boiling point greater than or equal to the melting point of the Sn—Bi based solder particles, the boiling point being 300° C. or lower.

16. The via paste according to claim 11, wherein the copper region is a joined unit comprised of the copper particles, and wherein the joined unit is configured to deform when force is applied to said joined unit.

17. The via paste according to claim 11, wherein the copper particles are in contact with the pair of wirings via plane contact portions.

* * * * *